United States Patent [19]

Fiorentino et al.

[11] 4,405,972
[45] Sep. 20, 1983

[54] CLAMP DEVICE FOR RETAINING PRINTED CIRCUIT BOARDS UNDER HIGH SHOCK CONDITIONS

[75] Inventors: Ermenegildo Fiorentino, Bridgeport; Edward A. Wojtowicz, Bryn Mawr; Robert J. Leadlie, Frazer, all of Pa.

[73] Assignee: Burroughs Corporation, Detroit, Mich.

[21] Appl. No.: 356,083

[22] Filed: Mar. 8, 1982

[51] Int. Cl.³ .............................................. H05K 7/12
[52] U.S. Cl. ................................. 361/417; 24/248 R; 24/259 FS; 211/41; 361/415; 361/419
[58] Field of Search ............... 361/415, 417, 418, 419, 361/420; 211/41; 24/259 FS, DIG. 9, DIG. 16, 248 R

[56] References Cited

U.S. PATENT DOCUMENTS

| | | | |
|---|---|---|---|
| 3,186,554 | 6/1965 | Mack et al. | 211/41 |
| 3,258,649 | 6/1966 | Arguin et al. | 361/417 |
| 3,410,001 | 11/1968 | Blum | 361/418 X |
| 3,794,887 | 2/1974 | Brennan et al. | 361/415 |
| 3,845,359 | 10/1974 | Fedele | 361/415 X |
| 3,975,805 | 8/1976 | Spurling et al. | 361/415 X |
| 4,214,292 | 7/1980 | Johnson | 361/415 X |
| 4,323,161 | 4/1982 | Marconi | 361/415 X |
| 4,368,821 | 1/1983 | Haseke | 361/415 X |

OTHER PUBLICATIONS

K. L. Manns, Circuit Board Support, IBM Tech. Disc. Bull., vol. 17, #1, Jun. 1974, p. 128.

Primary Examiner—R. R. Kucia
Attorney, Agent, or Firm—Francis A. Varallo; Mervyn L. Young; Kevin R. Peterson

[57] ABSTRACT

The present disclose describes a device which has particular utility in clamping printed circuit boards which are exposed to high shock conditions. This device includes a clamping bar which is permanently deformed in its fabrication process such that it assumes a curved or arcuate configuration. Employment of the clamp device involves physical contact between the edge of the printed circuit board and the bar, and the application of forces to the extremities of the latter, by mechanical fasteners to cause it to become substantially planar. The latter condition provides an evenly distributed high clamping force to the board without any high stress points which might cause board fractures. Accordingly, the present device increases the reliability of printed circuit boards as well as the electrical components mounted thereon, by providing exceptional printed circuit board rigidity.

11 Claims, 5 Drawing Figures

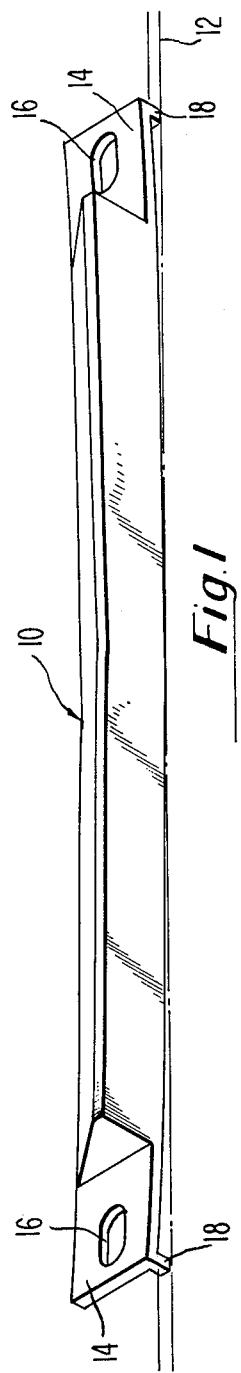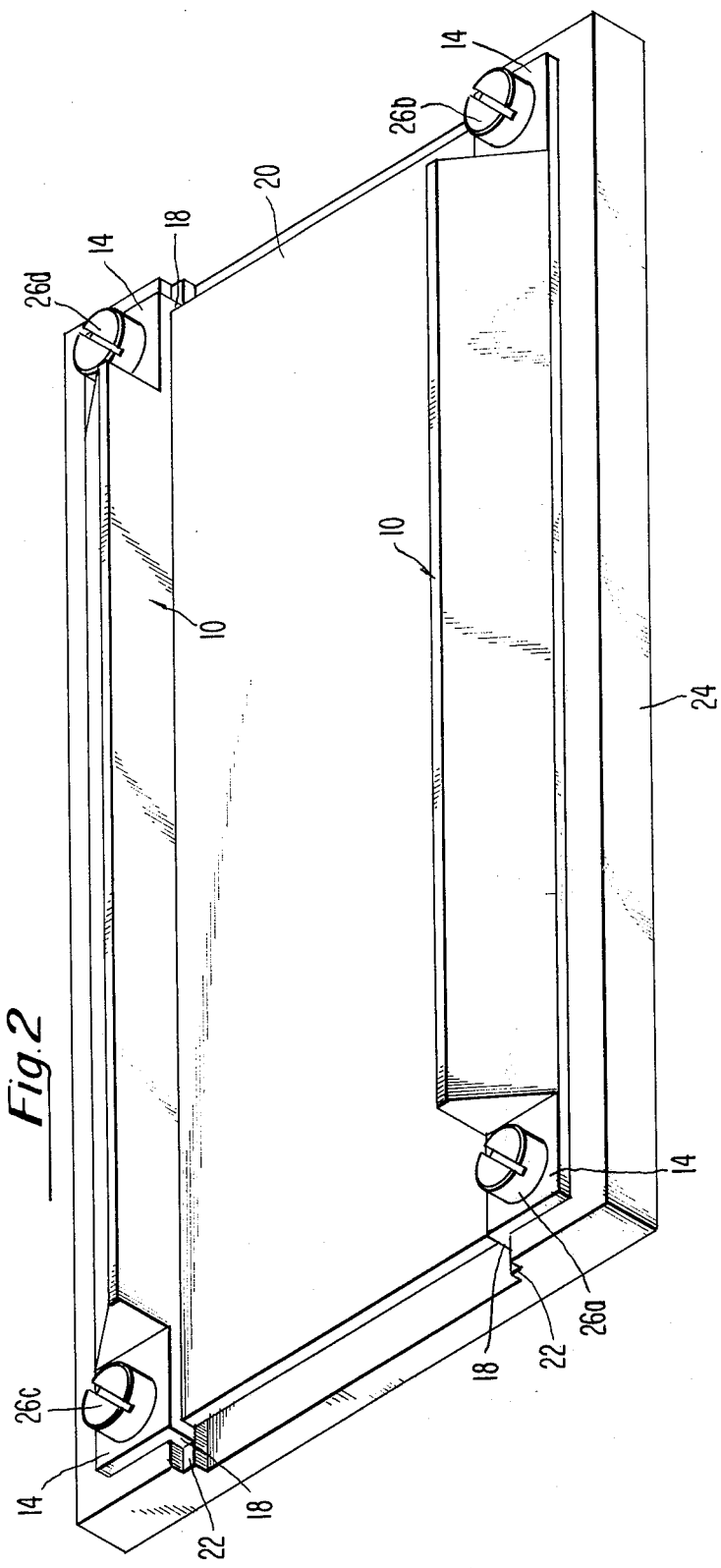

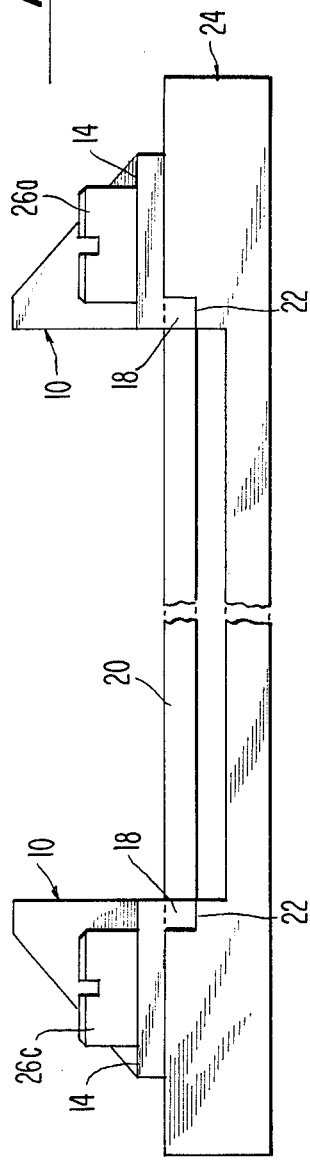
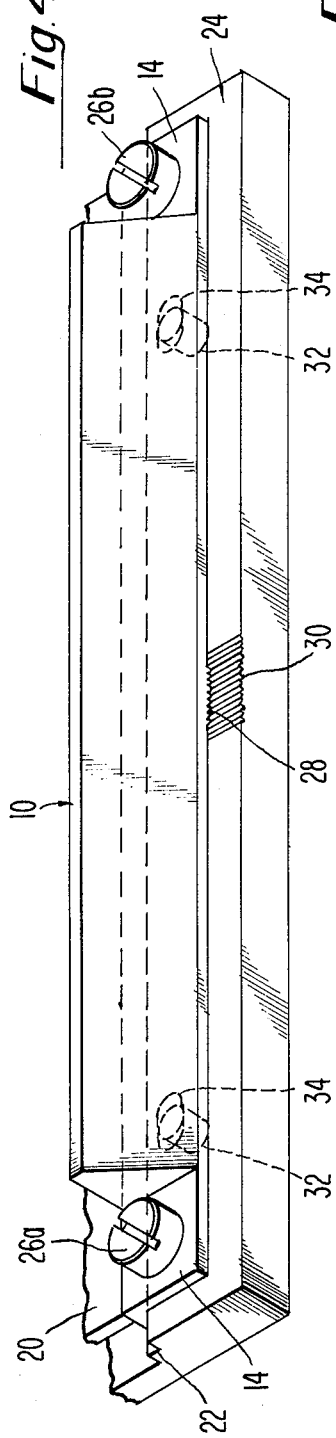
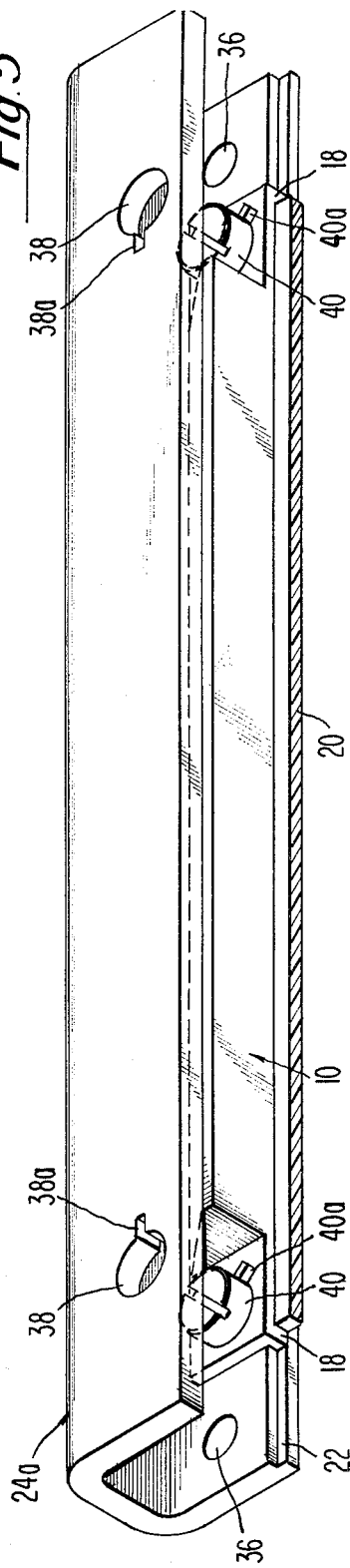

CLAMP DEVICE FOR RETAINING PRINTED CIRCUIT BOARDS UNDER HIGH SHOCK CONDITIONS

BACKGROUND OF THE INVENTION

The Government has rights in this invention pursuant to Contract No. N.60921-80-C-0204 awarded by the Department of the Navy.

Applications exist, such as in the meterological and geological fields, for electronic equipment in which the printed circuit boards present therein can be exposed to high shock conditions, of the order of 1000 to 4000 g's of acceleration, during their deployment. One of the problems created by these levels of acceleration or deceleration is that the printed circuit board experiences a deflection due to the fact that it is generally supported on its edges, as a simple supported beam. If the deflection is severe, it can in turn, tend to exert bending forces on ceramic components mounted on the printed circuit board. Ceramic dual in line packages (DIPS) frequently catastrophically fail by fracturing under shock conditions, because ceramic materials are weak in tension. In some cases, it is believed that printed circuit board deflections are transmitted to mounted DIP's by virtue of conformal coatings or encapsulation means. A dual in line package is normally somewhat isolated from the deflections in its mounting board, in that it is separated from the board by virtue of its input/output pins. However, the conformal coating applied to prevent moisture absorption by the electronic component, can act detrimentally by nullifying the isolation normally afforded by the supporting pins.

It is apparent from the foregoing that failures of electronic equipment due to deflection of printed circuit boards under high shock conditions may be minimized by reducing such deflections. Some of the techniques which may be employed to achieve the latter effect, include providing a thicker printed circuit board to increase its resistance to bending. This approach has the disadvantage of increasing the weight of the equipment, and the full effect of the increase in area moment of inertia is not realized. Moreover, since printed circuit boards utilize plated-through holes, the maximum thickness of the boards is limited by the practicality of obtaining such holes.

A second method of reducing deflections under shock loading is to decrease the span between the supporting edges of the printed circuit board and to provide center supports. Both of these have the effect of decreasing the component count on the individual boards, rendering the required design volumes larger than that which is available in some applications.

Finally, deflections may be minimized by providing rigid mountings for the boards which approximate indeterminate beam conditions. In this case, very little deflection is expected because the edges of the printed circuit board are prevented from rotating up under an applied load at the board's center of gravity. Therefore, the higher the applied clamp loads on the respective edges, the greater the board rigidity, and therefore, the smaller the deflection.

Indeterminate beam mountings are also advantageous because they do not require center supports for the board, thereby maximizing the available component area. It is also important that the rigid mounting include provision for restraining the board along its longitudinal axis. Prevention of axial board movements under shock conditions have the effect of eliminating the destructive impacts which occur under these conditions.

The clamp device of the present invention meets the need for such rigid mounting criteria.

SUMMARY OF THE INVENTION

In accordance with the present invention there is provided a clamp device capable of exerting a uniform high clamping force to the edge of a printed circuit board.

The device is comprised of a clamping bar and a base member. The latter supports the printed circuit board and permits the bar to be affixed thereto during the clamping operation. It is apparent that the base member may assume different physical configurations in accordance with the design of the electronic equipment in which it is employed.

The principal feature of the present clamp device resides in the operation of the clamping bar. The latter is permanently deformed in its fabrication process such that the surface thereof which is to contact the edge of the printed circuit board is curved or bowed. That is, as viewed from the surface of the board, the clamping bar is convex, the extremities thereof being farthest displaced from the board surface. Board retention tabs are also provided at the respective extremities of the clamping bar, contiguous with the edge which is to contact the edge of the printed circuit board. Such tabs will resist any board axial movement, relative to the clamp surface.

In utilizing the clamp device, the corresponding parallel edges of the printed circuit board are gripped by the respective edges of a pair of clamping bars. The extremities of each bar are provided with apertures for receiving screw fasteners which engage corresponding threads in holes in the base member. The screw at a first bar extremity is tightened down first, and then the opposite clamping screw is tightened. The latter operation causes a force to be applied to the printed circuit board in the vicinity of the first bar extremity. This force progresses toward the opposite end of the bar, as the clamping screw is tightened, until the clamping bar is completely straight. The entire edge of the printed circuit board will therefore be in contact with the bar, and a distributed force is brought to bear on the board which is equivalent to that required to straighten the bar after its deformation in the fabrication process.

Further embodiments of the invention are described in detail hereinafter. These include a transverse restraint for critical positioning of the clamping bar edge with respect to the edge of the printed circuit board and/or an axial restraint for use under extreme conditions which augments the frictional resistance to normally high shock conditions provided by the clamp itself as it contacts the base member.

A still further embodiment provides a modular approach to the clamp device in that each assembly comprised of a clamping bar and base member is independent, rather than having a pair of bars associated with a common base member.

Summarizing the advantages of the clamp device of the present invention, it should be observed that a very high clamping force capability is provided in a very small volume. The force level obtainable can approximate the yield point stress in compression of the printed circuit board material. This high clamp force, in turn, provides high board rigidity and minimal deflections under high shock conditions.

In contrast to the use of a straight clamping bar, the bowed configuration yields a distributed, uniform loading of the printed circuit board surface. This permits high loads to be applied via the tightening screws without the fear that a localized stress condition would fracture the board material. Moreover, the initial bowed deformation provides a convenient means of visually determining that the correct clamp force has been applied. This is the case since the force associated with a completely straightened clamping bar is known, and therefore a torque wrench is not required to assure that the correct clamping force has been obtained. The design preload on the printed circuit board is present when the clamping bar is on the verge of being completely straightened. The degree of bowing, and therefore the resulting force, can easily be changed to suit requirements, by permanently deforming the clamp to a different deflection.

The tabs present on the extremities of the clamping bar physically prevent printed circuit board movement relative to the bar in an axial direction, and therefore prevent high impact forces from developing. They also serve as stops during the application of the clamping forces. Slots disposed in the clamping bar permit axial adjustments of the bar/board combination to be made, in order, for example, that board electrical components may be interfaced with interconnection means.

The present invention provides for simple insertion and removal of the printed circuit board. Thus, the screw fasteners provide a high mechanical advantage and as such permit an almost effortless clamping through multiple turns thereof. The clamp device also exhibits zero insertion force characteristics between the clamping bar and board, since the fully loosened clamp condition effectively removes all preload from the printed circuit board.

Other features and advantages of the clamp device of the present invention will become more apparent in the detailed description which follows.

BRIEF DESCRIPTION OF THE DRAWINGS

FIG. 1 is a pictorial view of the clamping bar of the present device, shown with respect to a planar reference, in its fabricated curved shape.

FIG. 2 is a plan view of an operative assembly of the clamp device in which a printed circuit board is restrained by a pair of the clamping bars of FIG. 1.

FIG. 3 is an end view of the assembly of FIG. 2 illustrating particularly the axial restraining tabs on the extremities of the clamping bars.

FIG. 4 illustrates additional transverse and axial restraints which may be applied to the assembly of FIG. 2.

FIG. 5 illustrates a modular embodiment of the clamp device of the present invention.

DESCRIPTION OF THE PREFERRED EMBODIMENTS

FIG. 1 illustrates a stainless steel clamping bar 10 configured as used in an actual operative embodiment of the clamp of the present invention. As such, the bar exhibits a generally triangular cross section. It should be understood that this geometry and the bar material was chosen for a particular packaging design and application and the invention is not to be considered limited thereto. The clamping bar 10 of FIG. 1 is shown in its free or unclamped state. Thus, the bar is considered to have been permanently deformed in the fabrication process by bending it to a curved or bowed configuration as is apparent by reference to line 12. As an alternative to bending, the bar may be formed by an investment casting process to achieve any desired curvature. The optimum deformation curve is one which applies an even pressure throughout the clamping area. This criteria is met by a parabolic surface, since the locus of a deflected cantilever beam is a parabola. On the other hand, a deformation approximating a full length radius, or one in which the center section of the bar exhibits a relatively sharp radius and the adjacent sections are relatively straight, provide an evenly distributed pressure which is only slightly less than the optimum.

The use of a clamping bar with a bowed clamp surface is a significant feature of the present invention. The bowed surface is superior to a straight clamp surface for the following reasons. With a straight bar, the clamp force is applied at the screws and its distribution depends on the geometry of contact of the bar to the clamped surface. In many applications, distribution of clamp force is not of paramount importance, since the materials are not normally subjected to failure by localized stresses. The force profile on a straight bar will be high at the point of application of the screw forces, and low in the areas farthest away from the screws. In the bowed surface, the normal variations of geomtery are eliminated by the application of a relatively evenly distributed force throughout the length of the bar.

During the printed circuit board clamping operation, a progressive force is applied to the board wherein each increment of length must be pressurized before the adjacent increment sees a contact force from the clamping bar. The result is that the full length of the printed circuit board is exposed to a relatively even force distribution, rather than the creation of high and low force areas, as in a straight bar. Actually, the forces at the screws in a bowed bar will be lower than those in the remaining length of the bar, since these surfaces are the last to contact the clamp surface. In summary, the bowed surface contemplated by the present invention provides a clamping force that is approximately evenly distributed, and in turn, maintains the ratio of clamping stress to applied force low in comparison to that exhibited by straight surface clamps.

With continued reference to FIG. 1, the extremities 14 of the bar 10 are of a thin flat construction to provide a surface for a screw head to bear against, during the clamping operation. A screw slot 16 is also provided, in order to permit some axial adjustment of the bar relative to two fixed clamping screws. A pair of board retention tabs 18 are provided at the extremities of the bar, the function of which will be described hereinafter.

With reference to FIG. 2, a pair of clamping bars 10 are shown in their clamped position, exerting respective distributed forces along the edges of a printed circuit board 20. The latter is disposed on ledges 22 of a common base member 24.

In practice, the clamping operation is performed by inserting the printed circuit board 20 into the base member 24 by sliding it along the ledges 22. The board thickness is slightly greater than that from the surface of the ledge to the clamping surface of the base member. It is assumed that the screws 26a–26d are in a loosened state and the clamping bars 10, in their free, unclamped bowed shape. Thus, the board 20 may be inserted into base member 24 under zero insertion force conditions. The pair of tabs 18 on the respective ends of each clamping bar 10 are aligned with the longitudinal extremities of the printed circuit board 20. As seen in the end view of FIG. 3, the tabs 18 contact the board extremities when the clamping forces are applied. The primary purpose of the tabs 18 is to prevent any board axial movement relative to the clamping bar 10 under high shock conditions.

The screws 26a–26d are then tightened as follows. Screw 26b is tightened down, followed by the tightening of screw 26a at the clamping bar opposite extremity. The latter operation causes a force to be applied to the longitudinal edge of the printed circuit board in the vicinity of screw 26b. This force progresses toward screw 26a until the clamping bar 10 is completely straight. The tabs 18 contact the ledge 22 and serve to limit the amount of force which may be applied via screws 26a and 26b. A similar operation is performed with screws 26c and 26d. The entire longitudinal edges of the printed circuit board 20 will then be in contact with the respective bars 10, and distributed forces are brought to bear on the board 20 which are equivalent to those required to straighten the bars 10 after their deformation in the fabrication process. In an actual embodiment, a printed circuit board area of 1/16 inch width and equal to the length of the clamping bar 10 is securely fastened to the base 24 by the distributed load. The minimal overlap of the clamps 10 on the printed circuit board edges maximizes the board area which may be populated with electronic components.

In removing a printed circuit board 20 from the clamp device, the loosening of one of the screws, such as screw 26a, causes the opposite screw 26b to act as a pivot. Elastic forces stored in the deformed clamp push against the head of the loosening screw 26a and follow its position during the loosening process. Similarly, screws 26c and 26d are loosened. Finally, the printed circuit board 20 may be removed under substantially zero force conditions from the clamp device.

The device described hereinbefore in connection with FIGS. 1–3 is suitable for high shock conditions in a variety of applications. However, under extreme shock conditions, the axial retention force of the clamp which is dependent upon friction between the clamping bar 10 and the base member 24 may be augmented as shown in FIG. 4, without compromising the clamp axial adjustability.

Under extreme shock conditions, the printed circuit board axial load will tend to overcome the frictional forces between the board 20 and the clamping bar 10. These forces will be transmitted to the bar 10 through tabs 18. The bar will tend to resist movement, by virtue of its frictional contact with the base member 24. In order to limit the amount of motion possible under this condition, the clamp resisting force is increased by utilizing a series of teeth or serrations 28 in the surface of the clamping bar 10 which contacts the base member 24, and mating serrations 30 in the latter. The meshing of these serrations provide a shear force resisting capability, which is much greater than that provided by the normal friction.

With continued reference to FIG. 4, there is illustrated a means for more precise control of the overlap of the clamping bar 10 on the edge of the printed circuit board in applications wherein the latter dimension is critical. Such a condition exists where the electrical component and circuit path densities on the board are so great that the latter must be positioned very close to the edge of the clamping bar 10. Thus, while screws 26a–26d themselves, provide a suitable lateral restraint for most applications, special situations may be accommodated by utilizing a pair of pins 32 integral with each clamp 10. These pins 32 are designed to fit closely in mating slots 34 in the base member 24. The screws 26a–26d would then perform their primary purpose of applying clamping force, rather than to obtain lateral clamping bar positioning.

FIG. 5 illustrates a modular embodiment of the invention wherein the substantially planar base member 24 common to the pair of clamping elements 10, as seen in FIG. 2, is replaced with a separate C-shaped base member 24a for each clamping element 10. The C-shape geometry of base member 24a provides the strength and rigidity required during clamping of the printed circuit board 20. On the other hand, the base member 24a may be mounted on a relatively weak subassembly by mounting bolts inserted through apertures 36. Apertures 38 having contiguous slots 38a are provided in the upper planar section of the C-shaped base member 24a to accept the screws 40 and their integral tangs 40a. Once inserted through apertures 38, the screws 40 are held captive within base member 24a. Apart from convenience of assembly, this arrangement along with the shape of the base member, limits the upward motion of the extremities of the clamping bar 10.

As described in connection with FIG. 2, the edge of the printed circuit board 20 is positioned on ledge 22, and the screws 40 tightened in turn to provide a uniformly distributed force to the board edge. Tabs 18 engage the respective extremities of the board 20 and serve as stops to prevent the application of excessive force. The board surface to be engaged by clamp 10 and the corresponding width of ledge 22 may be chosen to suit the application. Similarly, the width of the active board surface may be selected as needed since the modular base member 24a is not limitative of the latter.

In conclusion, there has been described a clamping device which has particular utility in clamping printed circuit boards in high shock environments. It is apparent that depending upon the particular application, changes and modifications of the clamping bar and base member of the clamp device may be required. Such changes and modifications, insofar as they are not departures from the true scope of the invention, are intended to be covered by the following claims.

What is claimed is:

1. A clamp device for restraining a printed circuit board comprising:
    a base member against which said printed circuit board is to be clamped,
    at least one clamping bar having in its free unclamped state a clamping surface which exhibits a convex curvature when viewed from the direction of said printed circuit board,
    fastener means for applying clamping forces to the respective extremities of said clamping bar of such magnitude that the curved clamping surface thereof is straightened and brought to bear against the surface of said printed circuit board,
    said clamping bar exerting in its clamped state a substantially evenly distributed force to said printed circuit board, said last mentioned force being a function of the clamping forces required to straighten said curved clamping surface.

2. A clamp device as defined in claim 1 further including a pair of tabs positioned at the respective ends of said clamping bar for engaging the extremities of said printed circuit board, said tabs preventing longitudinal axial movements of said printed circuit board in either direction with respect to said clamping bar.

3. A clamp device as defined in claim 2 wherein said base member includes at least one planar surface for engaging a portion of said clamping surface of said clamping bar, and a ledge situated below said planar surface for supporting the edge of said printed circuit board, the thickness of said printed circuit board being greater than the distance between said planar surface and the surface of said ledge whereby the remainder of said clamping surface of said clamping bar engages the edge of said printed circuit board.

said pair of tabs contacting said surface of said ledge when said clamping bar is in its clamped state and preventing the application of additional forces to said printed circuit board by said fastener means.

4. A clamp device as defined in claim 3 wherein said clamping bar includes longitudinally oriented slots at said respective extremities of said clamping bar for receiving screw-type fasteners, said base member having corresponding threaded apertures for engaging said last mentioned fasteners, said slots permitting longitudinal adjustments of said clamping bar and said printed circuit board with respect to said base member.

5. A clamp device as defined in claim 4 wherein said base member is a unitary structure comprised of a pair of planar surfaces joined by a central depressed area having ledges disposed on opposite sides thereof, said ledges accommodating the edges of said printed circuit board, a pair of clamping bars mounted on said respective planar surfaces, a portion of the clamping surfaces of said clamping bars engaging the respective edges of said printed circuit board when said clamping bars are both in a clamped state.

6. A clamp device as defined in claim 5 further characterized in that at least a portion of the clamping surfaces of said clamping bars which engage the respective planar surfaces of said base member include a plurality of closely-spaced, transversely oriented serrations, each of said planar surfaces of said base member having a plurality of mating serrations, the engagement of the last mentioned pluralities of serrations providing a longitudinal axis shear force resisting capability which augments the friction force provided by said clamping bar, thereby preventing longitudinal movements of said clamping bar and said printed circuit board with respect to said base member while retaining longitudinal axis adjustability of said clamp device.

7. A clamp device as defined in claim 6 further characterized in that each of said clamping bars includes a plurality of pins integral therewith and projecting from said clamping surface thereof, a plurality of longitudinally disposed mating slots formed in each of said planar surfaces of said base member for receiving said pins, said pins providing for precise transverse axis control of the clamping surfaces which overlap the edge surfaces of said printed circuit board.

8. A clamp device as defined in claim 7 wherein each of said clamping bars exhibits a central generally triangular cross section with a relatively thin flat rectangular cross section at each extremity thereof.

9. A clamp device as defined in claim 4 wherein said base member is a unitary C-shaped structure comprised of a pair of members lying in parallel, spaced-apart planes and a third member lying in a transverse plane and joining homologous extremities of said pair of members, said clamping bar being mounted within said C-shaped structure on one of said pair of members, said latter member having a ledge for receiving the edge of the printed circuit board to be clamped.

10. A clamp device as defined in claim 9 further characterized in that the second of said pair of members includes a pair of apertures each having a contiguous slot, said screw-type fasteners each including integral tangs which readily pass through said apertures and slots and are thereafter substantially captured within said C-shaped structure.

11. A clamp device as defined in claim 10 wherein said one of said pair of members includes a plurality of apertures to facilitate its further mounting.

* * * * *